(12) United States Patent
Lim

(10) Patent No.: US 9,496,055 B2
(45) Date of Patent: Nov. 15, 2016

(54) SEMICONDUCTOR MEMORY DEVICE INCLUDING FLAG CELLS

(71) Applicant: SK hynix Inc., Gyeonggi-do (KR)

(72) Inventor: Sang Oh Lim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/249,008

(22) Filed: Apr. 9, 2014

(65) Prior Publication Data

US 2014/0307498 A1    Oct. 16, 2014

(30) Foreign Application Priority Data

Apr. 10, 2013    (KR) ........................ 10-2013-0039410

(51) Int. Cl.
| | |
|---|---|
| *G11C 29/52* | (2006.01) |
| *G11C 11/41* | (2006.01) |
| *G11C 29/04* | (2006.01) |
| *G11C 29/44* | (2006.01) |

(52) U.S. Cl.
CPC ............... *G11C 29/52* (2013.01); *G11C 11/41* (2013.01); *G11C 2029/0411* (2013.01); *G11C 2029/4402* (2013.01)

(58) Field of Classification Search
None
See application file for complete search history.

(56) References Cited

U.S. PATENT DOCUMENTS

| | | | | |
|---|---|---|---|---|
| 7,505,318 B2* | 3/2009 | Fukuda | .............. | G11C 16/0483 365/185.09 |
| 7,636,261 B2 | 12/2009 | Shibata | | |
| 2008/0144380 A1* | 6/2008 | Youn | ................... | G11C 11/5642 365/185.09 |
| 2008/0155364 A1* | 6/2008 | Hwang | ............... | G11C 11/5642 714/724 |
| 2013/0141970 A1* | 6/2013 | Shibata | .................. | G11C 16/04 365/185.02 |

FOREIGN PATENT DOCUMENTS

KR    100782329    12/2007

\* cited by examiner

*Primary Examiner* — James G Norman
(74) *Attorney, Agent, or Firm* — IP & T Group LLP

(57) ABSTRACT

A semiconductor memory device includes a plurality of memory cells arranged in a row direction and a column direction, a plurality of word lines each connected to memory cells in a row among the memory cells, and a majority of bit lines each connected to memory cells in a column among the memory cells. One or more memory cells are distributed as flag cells among memory cells connected to each word line, and flag cells connected to a first word line and flag cells connected to a second word line that is disposed adjacent to the first word line among the word lines are connected to first and second bit lines, respectively.

19 Claims, 11 Drawing Sheets

SEMICONDUCTOR MEMORY DEVICE INCLUDING FLAG CELLS

CROSS-REFERENCE TO RELATED APPLICATION

The present application claims priority to Korean patent application number 10-2013-0039410 filed on Apr. 10, 2013, in the Korean Intellectual Property Office, the entire disclosure of which is incorporated by reference herein.

BACKGROUND

1. Technical Field

Various embodiments of the present invention relate to an electronic device. More specifically, the exemplary embodiments of the present invention relate to a semiconductor memory device.

2. Related Art

Semiconductor memory devices are memory devices implemented using a semiconductor such as silicon (Si), germanium (Ge), gallium arsenide (GaAs), or indium phosphide (InP). Semiconductor memory devices are generally classified into volatile memory devices and nonvolatile memory devices.

A volatile memory device is a memory device that loses stored data when a power supply is cut off. Examples of a volatile memory device include a static random-access memory (SRAM), a dynamic RAM (DRAM), and a synchronous DRAM (SDRAM). A nonvolatile memory device is a memory device that maintains stored data even when the power supply is cut off. Examples of a nonvolatile memory device include a read-only memory (ROM), a programmable ROM (PROM), an erasable programmable ROM (EPROM), an electrically erasable programmable ROM (EEPROM), a flash memory, a phase-change RAM (PRAM), a magnetic RAM (MRAM), a resistive RAM (RRAM), and a ferroelectric RAM (FRAM). The flash memory is largely classified into a NOR type and a NAND type.

Some of memory cells of a semiconductor memory device are defined as flag cells. Flag cells store data for managing main cells. As the degree of integration of memory cells increases, the risk of damaging data stored in flag cells may increase. For example, as a distance between memory cells decreases, various factors, such as a threshold voltage difference between memory cells and a high driving voltage, may increase the risk of damaging the data stored in memory.

BRIEF SUMMARY

Various embodiments of the present invention are directed to a technology for improving the reliability of flag data of a semiconductor memory device.

An exemplary embodiment of the present invention provides a semiconductor memory device including a plurality of memory cells arranged in a row direction and a column direction, a plurality of word lines each connected to memory cells in a row among the memory cells, and a majority of bit lines each connected to memory cells in a column among the memory cells, wherein one or more memory cells are distributed as flag cells among memory cells connected to each word line, wherein flag cells connected to a first word line and flag cells connected to a second word line that is disposed adjacent to the first word line among the word lines are connected to first and second bit lines, respectively.

One or more bit lines may be disposed between the first bit lines and the second bit lines.

Another exemplary embodiment of the present invention provides a semiconductor memory device including a plurality of memory cells arranged in a row direction and a column direction; and a majority of page buffers each connected to memory cells in a column among the memory cells, and divided into page buffer groups connected to respective input/output lines, wherein one or more memory cells are defined as flag cells among memory cells in each row, wherein flag cells of a first row and flag cells of a second row adjacent to the first row are connected to different page buffer groups.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION

The advantages and features of the present invention and methods of achieving the advantages and features will be described more fully with reference to the accompanying drawings, in which exemplary embodiments of the invention are shown. The invention may, however, be embodied in many different forms and should not be construed as being limited to the embodiments set forth herein; rather these embodiments are provided so that this disclosure will be thorough and complete, and will fully convey the concept of the invention to one of ordinary skill in the art.

Throughout the specification, it will be understood that when an element is referred to as being "connected" to another element, it may be "directly connected" to the other element or "indirectly connected" to the other element with intervening elements therebetween. It will be further understood that when a part "includes" or "comprises" an element, unless otherwise defined, the part may further include other elements, not excluding the other elements.

Figure 1:
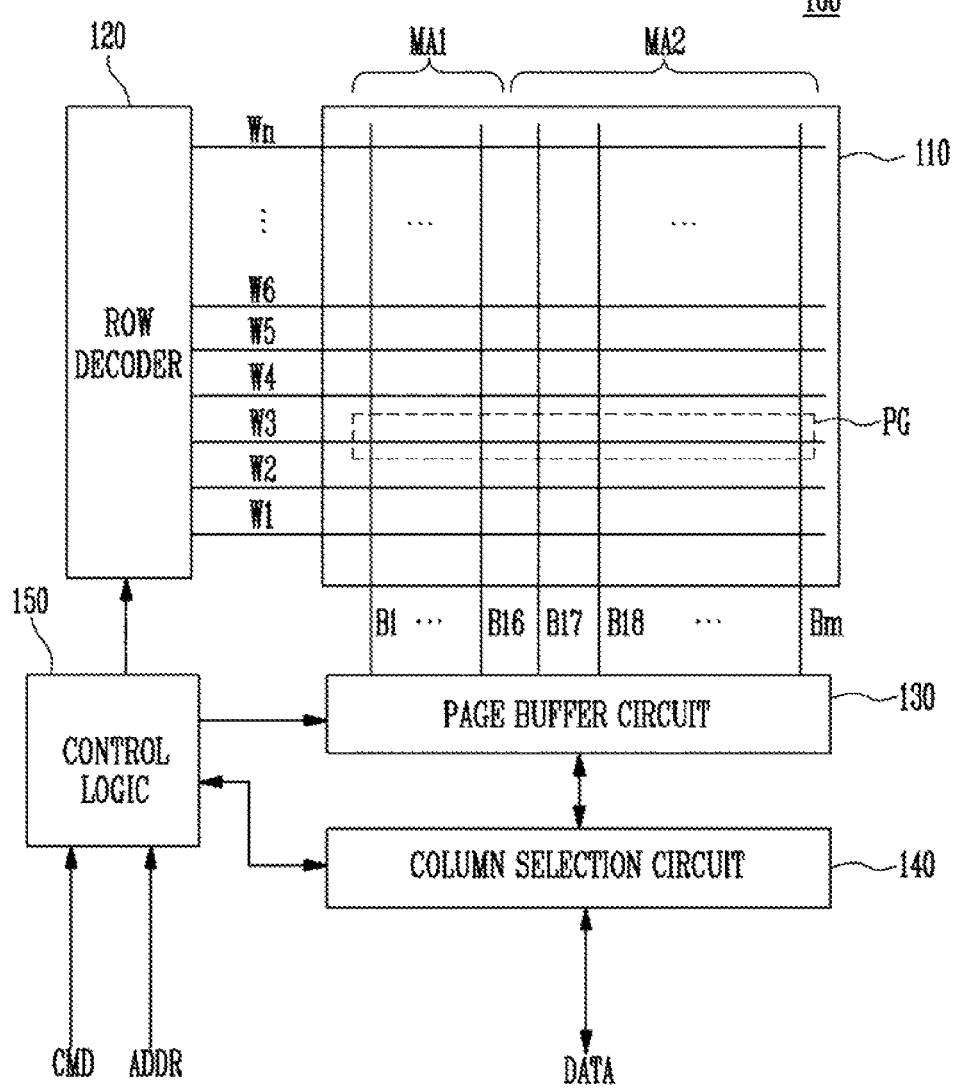
FIG. 1 is a block diagram illustrating a semiconductor memory device according to an embodiment of the present invention.

FIG. 1 is a block diagram illustrating a semiconductor memory device 100 according to an embodiment of the present invention.

Referring to FIG. 1, the semiconductor memory device 100 includes a memory cell array 110, a row decoder 120, a page buffer circuit 130, a column selection circuit 140, and a control logic 150.

The memory cell array 110 is connected to the row decoder 120 through a plurality of word lines W1 through Wn, and it is connected to the page buffer circuit 130 through bit lines B1 through Bm.

The memory cell array 110 includes a plurality of memory cells. The plurality of memory cells are arranged in a row direction and a column direction. The memory cells arranged in the row direction are connected to each word line. The memory cells arranged in the column direction are connected to each bit line.

It is described for simple explanation that the plurality of memory cells are located at respective intersections between the word lines W1 through Wn and the bit lines B1 through Bm. However, it is only for simple explanation, and thus the present embodiment is not limited thereto. For example, the memory cells arranged in the column direction may be connected in series to constitute one cell string, and the cell string may be connected to a corresponding bit line. For example, the memory cell array 110 may have a NAND flash memory array structure.

Memory cells connected to one word line constitute at least one page PG. For example, when each of memory cells is a single level cell (SLC), memory cells connected to one word line constitute one page PG. Alternatively, when each of memory cells is a multi level cell (MLC), memory cells connected to one word line constitute two or more pages.

Among memory cells connected to one word line, some memory cells are defined as flag cells and the remaining memory cells are defined as main cells. Flag cells store data for managing corresponding main cells. For example, flag cells may store information indicating whether data is stored in main cells. For example, flag cells may store information about whether least significant bit (LSB) data is stored in corresponding main cells, or whether LSB data and most significant bit (MSB) data are stored in corresponding main cells. The control logic 150 may control such information to be stored in flag cells.

The memory cells of the memory cell array 110 are divided into a first memory area MA1 and a second memory area MA2. Flag cells of each word line are disposed in the first memory area MA1. That is, the first memory area MA1 includes flag cells and main cells. The second memory area MA2 includes main cells. In FIG. 1, flag cells may be arranged in a zigzag form in the first memory area MA1, which will be explained in more detail with reference to FIG. 3.

The row decoder 120, the page buffer circuit 130, the column selection circuit 140, and the control logic 150 operate as peripheral circuits that drive the memory cell array 110.

The row decoder 120 is connected to the memory cell array 110 through the word lines W1 through Wn. The row decoder 120 is configured to operate under control of the control logic 150. The row decoder 120 receives a row address among addresses ADDR through the control logic 150.

The row decoder 120 selects one among the plurality of word lines W1 through Wn by decoding the received row address. For example, the row decoder 120 applies a first voltage to the selected word line and applies a second voltage to the remaining word lines, based on the decoded row address. For example, the semiconductor memory device 100 further includes a charge pump circuit that generates the first voltage and the second voltage, and applies the generated first and second voltages to the row decoder 120.

For example, the row decoder 120 may include an address buffer.

The page buffer circuit 130 is connected to the memory cell array 110 through the bit lines B1 through Bm. The page buffer circuit 130 operates under the control of the control logic 150. The page buffer circuit 130 includes a plurality of page buffers that are respectively connected to the bit lines B1 through Bm.

The page buffer circuit 130 is configured to program data to memory cells of the selected word line, or read data from the memory cells of the selected word line. During a program operation, the page buffers of the page buffer circuit 130 receive data DATA through the column selection circuit 140, and program the received data DATA to the memory cells of the selected word line. During a read operation, the page buffers of the page buffer circuit 130 read data from the memory cells of the selected word line, and output the read data to the column selection circuit 140.

The column selection circuit 140 is connected to the page buffer circuit 130, and operates under the control of the control logic 150. The column selection circuit 140 transmits/receives the data DATA to/from a global buffer (not shown) of the semiconductor memory device 100.

The column selection circuit 140 receives a column address among the addresses ADDR from the control logic 150, and decodes the received column address. During a program operation, the column selection circuit 140 transmits the data DATA to corresponding page buffers of the page buffer circuit 130 based on the decoded column address. During a read operation, the column selection circuit 140 receives the data DATA from the corresponding page buffers of the page buffer circuit 130 based on the decoded column address, and transmits the received data DATA to the global buffer.

The control logic 150 receives a command CMD and the addresses ADDR through the global buffer of the semiconductor memory device 100. The control logic 150 is configured to control the row decoder 120, the page buffer circuit 130, and the column selection circuit 140 in response to the command CMD.

During a program operation for flag cells, the control logic 150 may transmit to the column selection circuit 140 the column address along with data (hereinafter, referred to as flag data) that is to be stored in flag cells of the selected word line. The flag data is transmitted to the corresponding page buffers of the page buffer circuit 130 based on the column address, and the corresponding page buffers program the flag data to the flag cells of the selected word line.

During a read operation for flag cells, the control logic 150 provides the column address to the column selection circuit 140. When the flag data is read from the flag cells of the selected word line by the corresponding page buffers of the page buffer circuit 130, the column selection circuit 140 receives the flag data from the corresponding page buffers based on the column address, and provides the received flag data to the control logic 150.

Figure 2:
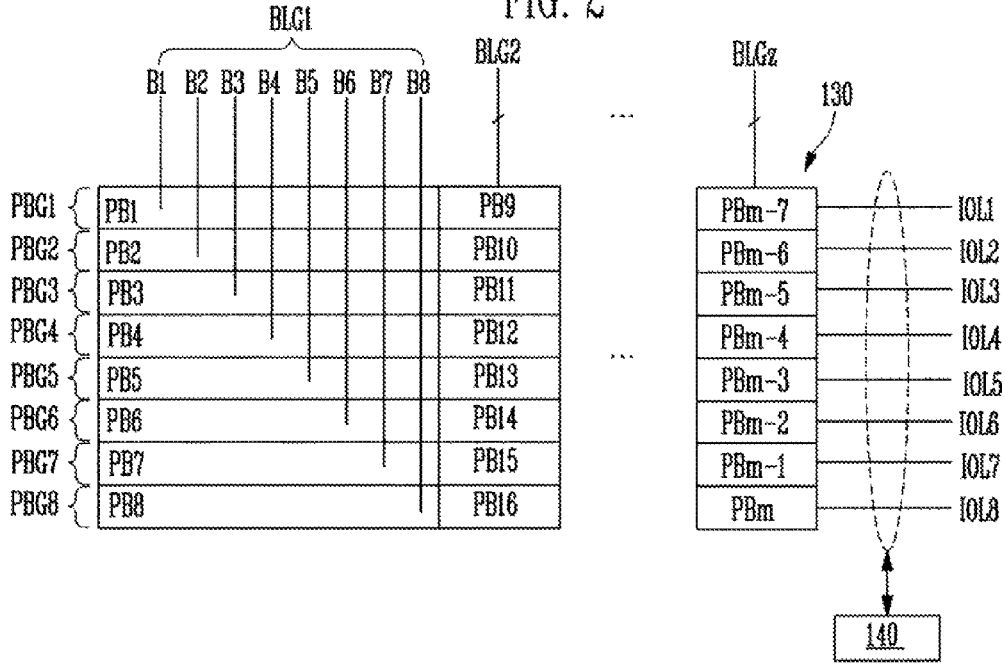
FIG. 2 is a block diagram illustrating a page buffer circuit of FIG. 1.

FIG. 2 is a block diagram illustrating the page buffer circuit 130 of FIG. 1.

Referring to FIG. 2, the page buffer circuit 130 includes a plurality of, that is, first through $m^{th}$ page buffers PB1 through PBm that are arranged in a row direction and a column direction. The first through $m^{th}$ page buffers PB1 through PBm are respectively connected to the first through $m^{th}$ bit lines B1 through Bm (see FIG. 1).

The first through $m^{th}$ bit lines B1 through Bm are divided into a plurality of bit line groups BLG1 through BLGz. It will be understood that although each of the first through $z^{th}$ bit line groups BLG1 through BLGz includes 8 bit lines (for example, B1 through B8) in FIG. 2, the present embodiment is not limited thereto.

Bit lines of one bit line group are connected to page buffers that are arranged in one column. The first through eighth bit lines B1 through B8 of the first bit line group BLG1 are respectively connected to the first through eighth page buffers PB1 through PB8 that are arranged in the column direction. Likewise, although not shown in FIG. 2, the remaining bit line groups BLG2 through BLGz are connected to corresponding page buffers PB9 through PBm. Eight bit lines of the second bit line group BLG2 are respectively connected to the ninth through $16^{th}$ page buffers PB9 through PB16. Eight bit lines of the $z^{th}$ bit line group BLGz are respectively connected to the m-$7^{th}$ through $m^{th}$ page buffers PBm-7 through PBm.

A page buffer group will now be defined. Page buffers that are arranged in one row constitute one page buffer group. The page buffers PB1, PB9 . . . , and PBm-7 of a first row constitute a first page buffer group PBG1. Page buffers PB2, PB10, . . . , and PBm-6 of a second row constitute a second page buffer group PBG2. Page buffers PB3, PB11, . . . , and PBm-5 of a third row constitute a third page buffer group PBG3. Page buffers PB4, PB12, . . . , and PBm-4 of a fourth row constitute a fourth page buffer group PBG4. Page buffers PB5, PB13, . . . and PBm-3 of a fifth row constitute a fifth page buffer group PBG5. Page buffers PB6, PB14, . . . , and PBm-2 of a sixth row constitute a sixth page buffer group PBG6. Page buffers PB7, PB15, . . . , and PBm-1 of a seventh row constitute a seventh page buffer group PBG7. Page buffers PB8, PB16, . . . , and PBm, of an eighth row constitute an eighth page buffer group PBG8.

The first through eighth page buffer groups PBG1 through PBG8 are respectively connected to first through eighth input/output lines IOL1 through IOL8. In this case, page buffers (for example, PB1 PB9, . . . , and PBm-7) of one page group (for example, PBG1) are commonly connected to a corresponding input/output line (for example, IOL1).

Page buffers of different rows may be connected to different input/output lines. Page buffers of the same row may be connected to the same input/output line.

Figure 3:
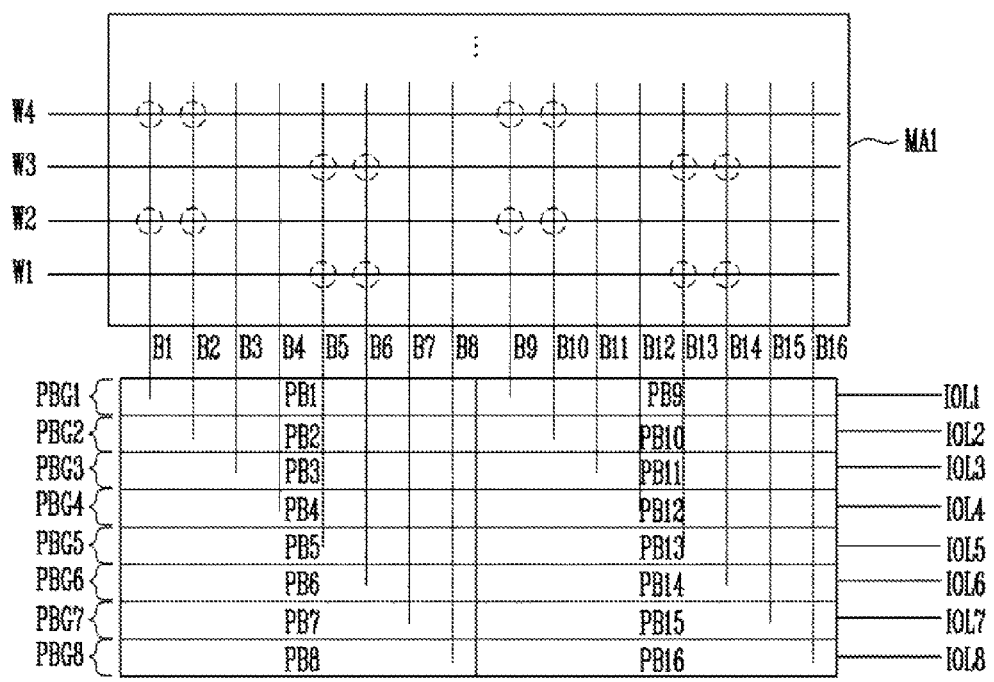
FIG. 3 is a block diagram illustrating a first memory area of FIG. 1 and page buffers that are connected to the first memory area.

The first through eighth input/output lines IOL1 through IOL8 are connected to the column selection circuit 140. The page buffers PB1 through PBm receive data from the column selection circuit 140 through the first through eighth input/output lines IOL1, through IOL8 and output data through the first through eighth input/output lines IOL1 through FIG. 3 is a block diagram illustrating the first memory area MA1 of FIG. 1 and the page buffers PB1 through PB16 that are connected to the first memory area MA1. In FIG. 3, among the first through $n^{th}$ word lines W1 through Wn, only the first through fourth word lines W1 through W4 are shown, and the remaining word lines W5 through Wn are not shown, for simple explanation.

Referring to FIG. 3, the first memory area MA1 includes memory cells that are connected to the first through $16^{th}$ bit lines B1 through B16. Some of the memory cells of the first memory area MA1 are defined as flag cells. As shown in FIG. 3, pairs of two adjacent flag cells may be distributed between main cells. The remaining memory cells are defined as main cells.

In FIG. 3, flag cells of any word line and flag cells of an adjacent word line to the word line are connected to different bit lines. For example, bit lines that are connected to flag cells of one word line may be spaced apart by a certain distance from bit lines that are connected to flag cells of another word line that is disposed adjacent to the one word line. Flag cells of a first word line W1 are connected to the fifth, sixth, $13^{th}$ and $14^{th}$ bit lines B5, B6, B13, and B14. Flag cells of a second word line W2 that is disposed adjacent to the first word line W1 are connected to the first, second, ninth, and tenth bit lines B1, B2, B9, and B10. Flag cells of a third word line W3 that is disposed adjacent to the second word line W2 are connected to the fifth, sixth, $13^{th}$, and $14^{th}$ bit lines B5, B6, B13, and B14. Flag cells of a fourth word line W4 that is disposed adjacent to the third word line W3 are connected to the first, second, ninth, and tenth bit lines B1 B2, B9, and B10.

Also, flag cells of any word line and flag cells of an adjacent word line to the word line are defined to be connected to different page buffer groups. The flag cells of the first word line W1 are connected to the fifth and sixth page buffer groups PBG5 and PBG6, the flag cells of the second word line W2 are connected to the first and second page buffer groups PBG1 and PBG2, the flag cells of the third word line W3 are connected to the fifth and sixth page buffer groups PBG5 and PBG6, and the flag cells of the fourth word line W4 are connected to the first and second page buffer groups PBG1 and PBG2.

Unlike in FIG. 3 only memory cells that are connected to specific bit lines (for example, B1 and B2) may be defined as flag cells of each word line. When flag data is programmed to the flag cells of each word line, the flag data may be damaged due to interference in the column direction. In detail, it is described as an example that program operations for the first through fourth word lines W1 through W4 are sequentially performed. First, flag data may be stored in a flag cell of the first word line W1. Next, when flag data is stored in a flag cell of the second word line W2 that is disposed adjacent to the first word line W1, the flag data that has been already stored in the flag cell of the first word line W1 may be damaged due to a program operation for the second word line W2. For example, the flat data stored in the flag cell of the first word line W1 may be damaged due to various factors such as a high program voltage applied to the second word line W2 and an increase in a threshold voltage of the flag cell of the second word line W2.

In FIG. 3, flag cells of any word line and flag cells of an adjacent word line to the word line are connected to different bit lines. The flag cells of any word line are spaced apart by a certain distance in the row direction from the flag cells of the adjacent word line that is disposed adjacent to the word line. For example, the flag cells of any word line may be spaced by at least two or more bit line pitches from the flag cells of the adjacent word line that is disposed adjacent to the word line. Accordingly, the reliability of flag data is improved.

It will be understood that although the first memory area MA1 includes memory cells that are connected to the first through $15^{th}$ bit lines B1 through B16 in FIG. 3, the present embodiment is not limited thereto. For example, the first memory area MA1 may include memory cells that are connected to the first through $32^{nd}$ bit lines B1 through B32. Alternatively, the first memory area MA1 may include memory cells that are connected to more bit lines.

Figure 4:
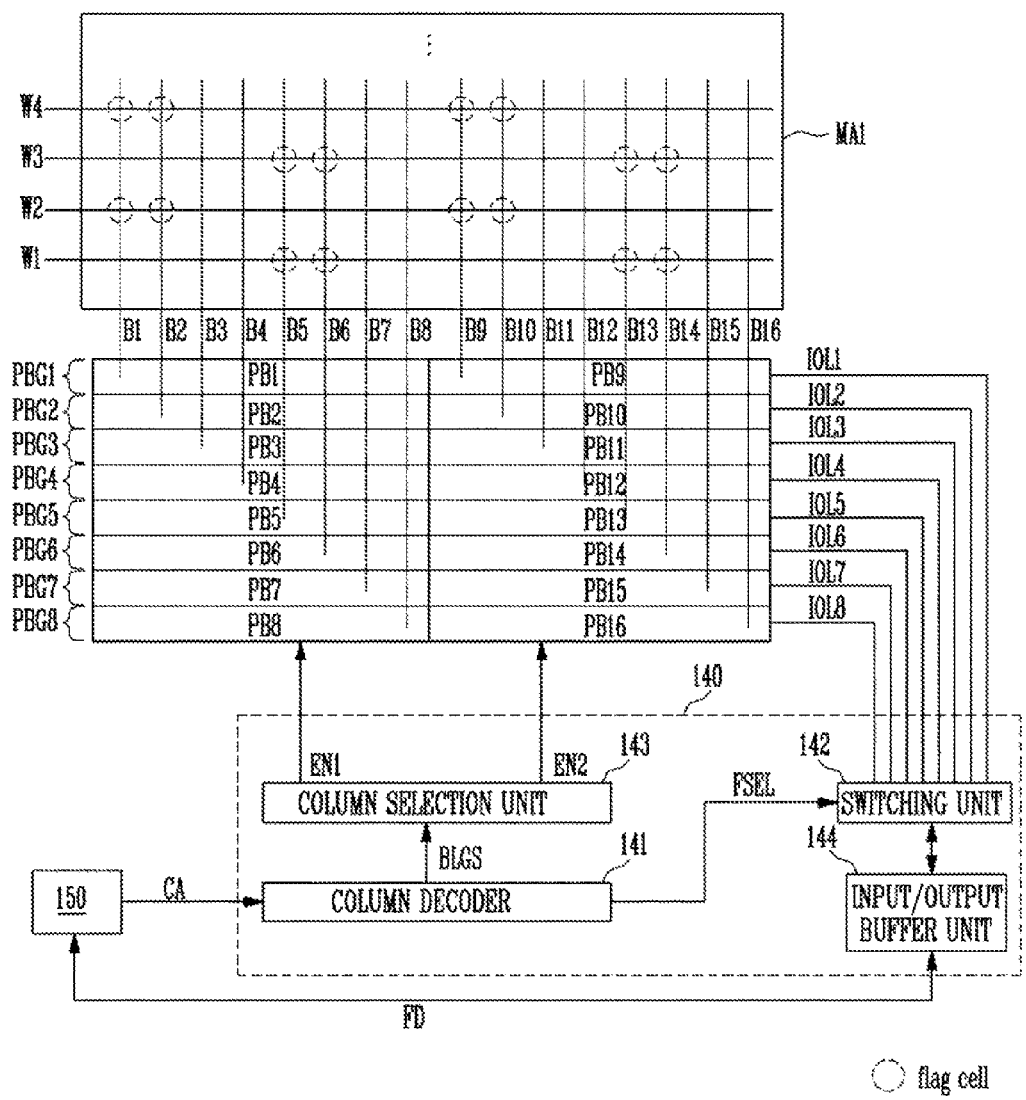
FIG. 4 is a block diagram for describing a process of transmitting data between the page buffers of FIG. 3 and a column selection circuit.

FIG. 4 is a block diagram for describing a process of transmitting data between the page beers PB1 through PB16 of FIG. 3 and the column selection circuit 140.

Referring to FIG. 4, the control logic 150 outputs a column address CA that indicates flag cells of a selected word line. In this case, the control logic 150 may select one word line among the word lines W1 through Wn by transmitting a row address to the row decoder 120.

For example, the control logic 150 may store the column address CA that corresponds to flag cells of each word line. The control logic 150 may generate a new column address CA whenever flag data FD is stored in each word line (or whenever flag data of each word line is read).

The column selection circuit 140 includes a column decoder 141, a switching unit 142, a column selection unit 143, and an input/output buffer unit 144.

The column decoder 141 receives the column address CA from the control logic 150. The column decoder 141 decodes the column address CA. The column decoder 141 transmits a flag selection signal FSEL to the switching unit 142 based on the decoded column address. Also, the column decoder 141 generates a bit line group selection signal BLGS for sequentially selecting the page buffers PB1 through PB8 of the first column and the page buffers PB9 through PB16 of the second column.

The switching unit 142 connects the first through eighth input/output lines IOL1 through IOL8 and the input/output buffer unit 144 in response to the flag selection signal FSEL. For example, when the fourth word line W4 is selected, since corresponding flag cells are connected to the first and second page buffer groups PBG1 and PBG2, the switching unit 142 may sequentially connect the first and second input/output lines IOL1 and IOL2 to the input/output buffer unit 144.

The column selection unit 143 receives the bit line group selection signal BLGS from the column decoder 141. The column selection unit 143 enables first and second enable signals EN1 and EN2 by decoding the bit line group selection signal BLGS. When the first enable signal EN1 is enabled, the first through eighth page buffers PB1 through PB8 are electrically connected to the first through eighth input/output lines IOL1 through IOL2, respectively. When the second enable signal EN2 is enabled, the ninth through $16^{th}$ page buffers PB9 through PB16 are electrically connected to the first through eighth input/output lines IOL1 through IOL8, respectively.

The input/output buffer unit 144 receives the flag data FD from the control logic 150 and transmits the received flag data FD to the switching unit 142 during a program operation. The input/output buffer unit 144 outputs the flag data FD received through the switching unit 142 to the control logic 150 during a read operation.

Figure 5:
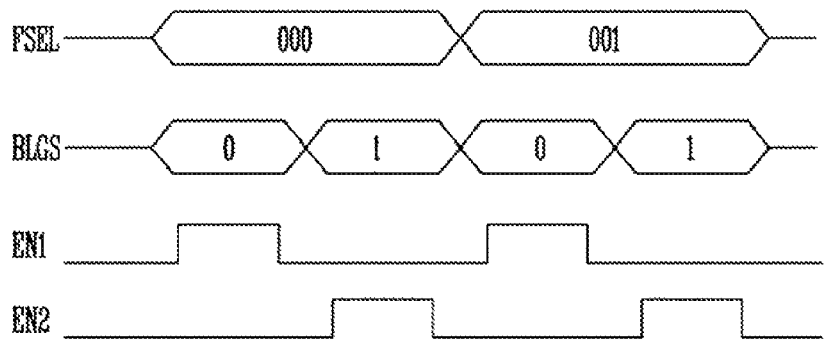
FIG. 5 is a timing diagram for describing an operation of the column selection circuit of FIG. 4.

FIG. 5 is a timing diagram for describing an operation of the column selection circuit 140 of FIG. 4. It is described as an example that the fourth word line W4 is selected in FIG. 5.

Referring to FIG. 5, the flag selection signal FSEL sequentially has a logic value "000" and a logic value "001" in response to the column address CA. Accordingly, the first and second page buffer groups PBG1 and PBG2 are sequentially selected. That is, when the logic value of the flag selection signal FSEL is "000", the switching unit 142 connects the first input/output line IOL1 to the input/output buffer unit 144, and when the logic value of the flag selection signal FSEL is "001", the switching unit 142 connects the second input/output line IOL2 to the input/output buffer unit 144.

When the logic value of the flag selection signal FSEL is "000" and the bit line group selection signal BLGS of a logic value "0" is provided, the first enable signal EN1 is enabled, and thus the first page buffer PB1 is connected to the input/output buffer unit 144. Next, when the bit line group selection signal BLGS of a logic value "1" is provided, the second enable signal EN2 is enabled, and thus the ninth page buffer PB9 is connected to the input/output buffer unit 144. As a result, the first and ninth page buffers PB1 and PB9 are sequentially connected to the input/output buffer unit 144 to communicate flag data. For example, during a program operation, flag data may be transmitted from the input/output buffer unit 144 to the first and ninth page buffers PB1 and PB9. During a read operation, flag data that is stored in the first and ninth page buffers PB1 and PB9 may be transmitted to the input/output buffer unit 144.

When the logic value of the flag selection signal FSEL is "001" and the bit line group selection signal BLGS of the logic value "0" is provided, the first enable signal EN1 is enabled, and thus the second page buffer PB2 is connected to the input/output buffer unit 144. Next, when the bit line group selection signal BLGS of the logic value "1" is provided, the second enable signal EN2 is enabled, and thus the tenth page buffer PB10 is connected to the input/output buffer unit 144. As a result, the second and tenth page buffers PB2 and PB10 may be sequentially connected to the input/output buffer unit 144 to communicate flag data.

In FIG. 5, the control logic 150 provides the column address CA for flag cells of a selected word line to the column selection circuit 140. Accordingly, even when column addresses of flag cells vary depending on word lines, flag data may be programmed or read.

Figure 6:
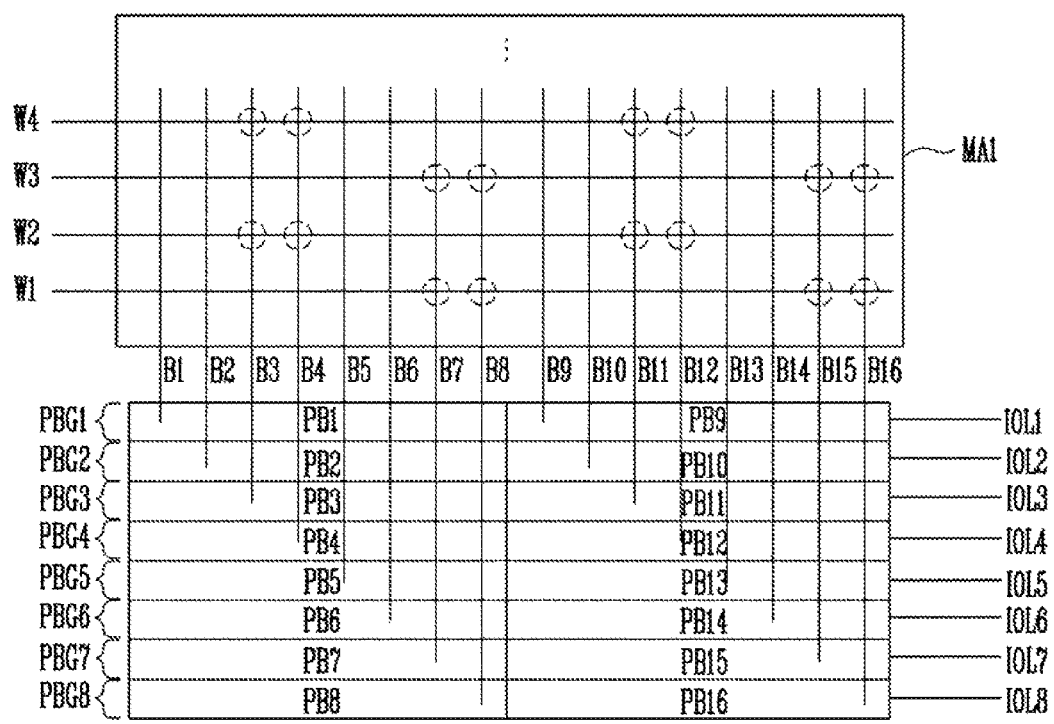
FIG. 6 is a block diagram illustrating an arrangement of flag cells, according to an embodiment of the present invention.

FIG. 6 is a block diagram illustrating an arrangement of flag cells, according to another embodiment of the present invention.

Referring to FIG. 6, flag cells of the first word line W1 are connected to the seventh, eighth, $15^{th}$, and $16^{th}$ bit lines B7, B8, B15, and B16. Flag cells of the second word line W2 that is disposed adjacent to the first word line W1 are connected to the third, fourth $11^{th}$, and $12^{th}$ bit lines B3, B4, B11, and B12. Flag cells of the third word line W3 that is disposed adjacent to the second word line W2 are connected to the seventh, eighth, $15^{th}$, and $16^{th}$ bit lines B7, B8, B15, and B16. Flag cells of the fourth word line W4 that is disposed adjacent to the third word line W3 are connected to the third, fourth, $11^{th}$, and $12^{th}$ bit lines B3, B4, B11, and B12. As such, flag cells of an odd numbered word line may be connected to the seventh, eighth, $15^{th}$, and $16^{th}$ bit lines B7, B8, B15 and B16, and flag cells of an even numbered word line may be connected to the third, fourth, $11^{th}$, and $12^{th}$ bit lines B3, B4, B11, and B12.

Figure 7:
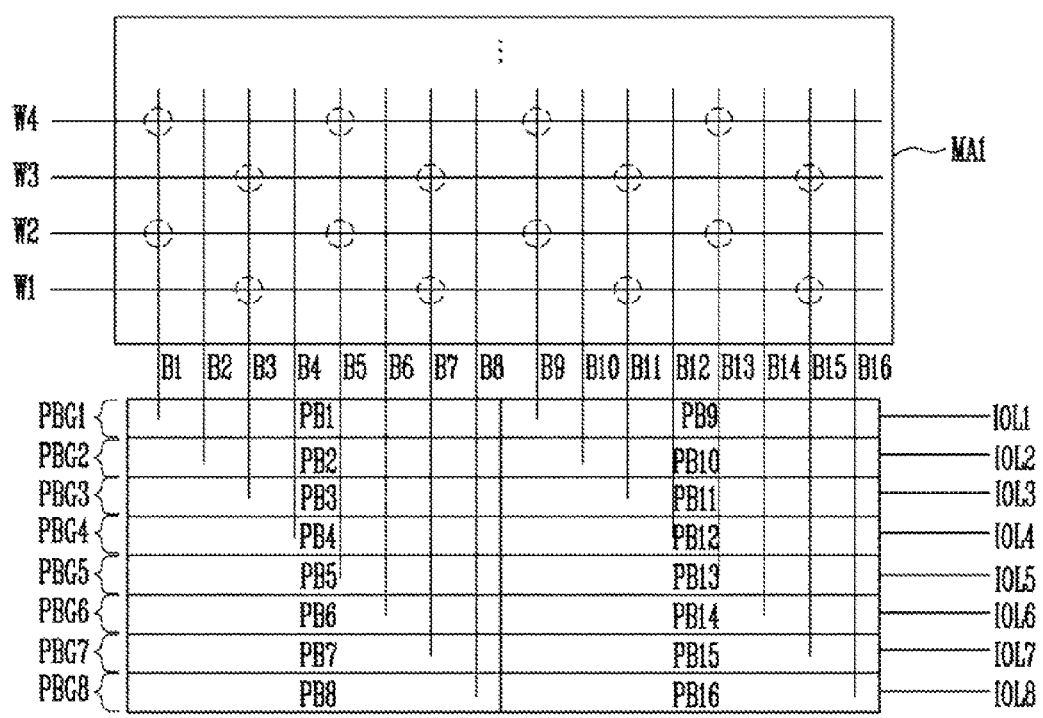
FIG. 7 is a block diagram illustrating an arrangement of flag cells, according to an embodiment of the present invention.

FIG. 7 is a block diagram illustrating an arrangement of flag cells, according to still another embodiment of the present invention.

Referring to FIG. 7, each of flag cells may be distributed as a basic unit between main cells. Flag cells of the first word line W1 are connected to the third, seventh, 11$^{th}$, and 15$^{th}$ bit lines B3, B7, B11 and B15. Flag cells of the second word line W2 that is disposed adjacent to the first word line W1 are connected to the first, fifth, ninth, and 13$^{th}$ bit lines B1, B5, B9, and B13. Flag cells of the third word line W3 that is disposed adjacent to the second word line W2 are connected to the third, seventh, 11$^{th}$, and 15$^{th}$ bit lines B3, B7, B11, and B15. Flag cells of the fourth word line W4 that is disposed adjacent to the third word line W3 are connected to the first, fifth, ninth, and 13$^{th}$ bit lines B1, B5, B9 and B13. As such, flag cells of an odd numbered word line may be connected to the third, seventh, 11$^{th}$, and 15$^{th}$ bit lines B3, B7, B11, and B15, and flag cells of an even numbered word line may be connected to the first, fifth, ninth, and 13$^{th}$ bit lines B1, B5, B9, and B13.

Figure 8:
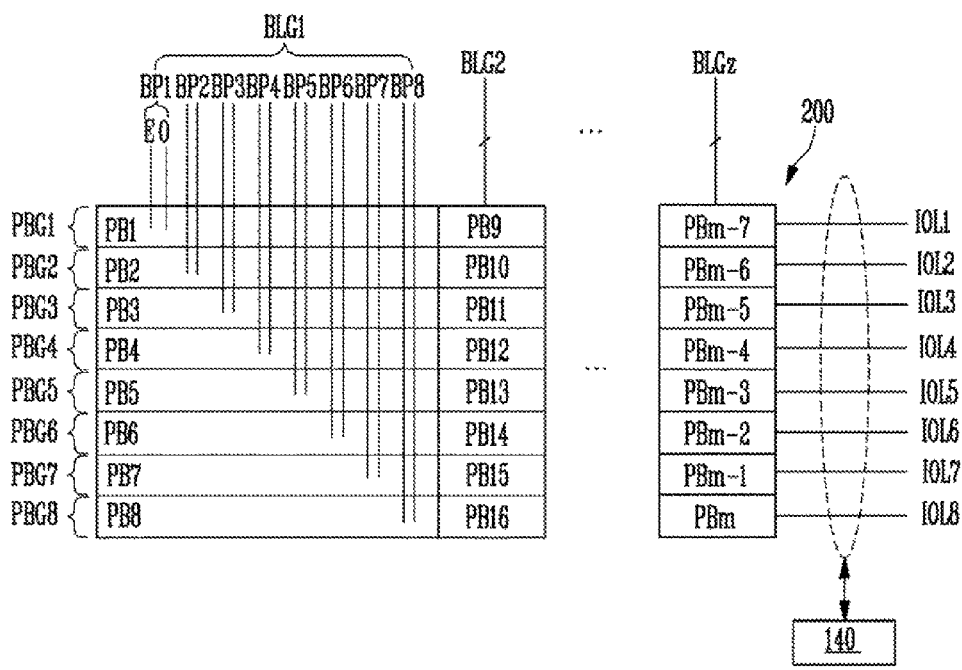
FIG. 8 is a block diagram illustrating the page buffer circuit of FIG. 1 according to an embodiment of the present invention.

FIG. 8 is a block diagram illustrating a page buffer circuit 2 according to another embodiment of the present invention.

Referring to FIG. 8, the page buffer circuit 200 includes a plurality of first through m$^{th}$ page buffers PB1 through PBm that are arranged in a row direction and a column direction. Each of the first through m$^{th}$ page buffers PB1 through PBm is connected to two bit lines, that is, a bit line pair BP. Page buffers that are arranged in one row constitute one page buffer group. In FIG. 8, the first through m$^{th}$ page buffers PB1 through PBm are divided into first through eighth page buffer groups PBG1 through PBG8, and the first through eighth page buffer groups PBG1 through PBG8 are respectively connected to the first through eighth input/output lines IOL1 through IOL8.

Each of the first through m$^{th}$ bit lines B1 through Bm (see FIG. 1) may be set to an even bit line E and an odd bit line O. One even bit line E and one odd bit line O constitute one bit line pair BP. One bit line pair BP is connected to one page buffer PB.

A plurality of bit line pairs are divided into a plurality of bit line groups BLG1 through BLGz. For example, each of the plurality of bit line groups BLG1 through BLGz may include 8 bit line pairs.

Bit line pairs included in one bit line group are connected to page buffers that are arranged in one column. First through eighth bit line pairs BP1 through BP8 that are included in the first bit line group BLG1 are respectively connected to the first through eighth page buffers PB1 through PB8. Likewise, the remaining bit line groups BLG2 through BLGz are connected to corresponding page buffers PB9 through PBm.

Figure 9:
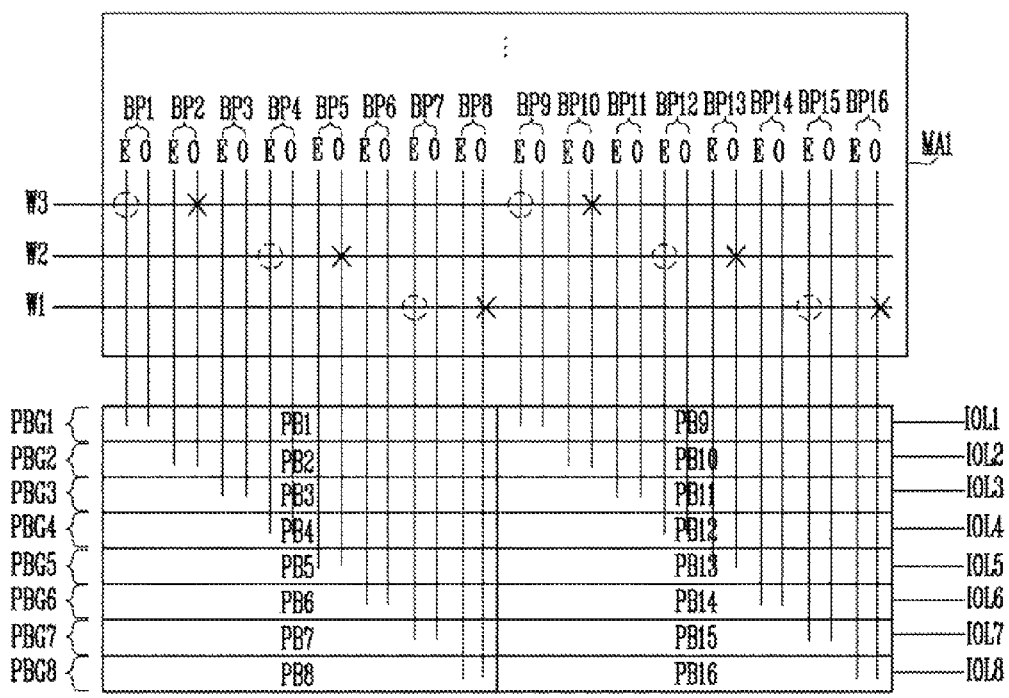
FIG. 9 is a block diagram illustrating the first memory area and page buffers that are connected to the first memory area.

FIG. 9 is a block diagram illustrating the first memory area MA1 and the page buffers PB1 through PB16 that are connected to the first memory area MA1. In FIG. 9, among the first through n$^{th}$ word lines W1 through Wn, only the first through third word lines W1 through W3 are shown and the remaining word lines W4 through Wn are not shown, for simple explanation.

Referring to FIG. 9, memory cells are connected to the plurality of bit line pairs BP1 through BP16. In this case, a memory cell that is connected to each even bit line E is defined as an even memory cell, and a memory cell that is connected to each odd bit line O is defined as an odd memory cell. That is, an even memory cell and an odd memory cell are connected to different bit lines.

Among memory cells that are connected to one word line, even memory cells constitute an even page. Among memory cells that are connected to one word line, odd memory cells constitute an odd page. That is, memory cells of each word line constitute an even page and an odd page.

In FIG. 9, a flag cell of an even page (hereinafter, referred to as an even flag cell) and a flag cell of an odd page (hereinafter, referred to as an odd flag cell) of each word line are shown. In FIG. 9, flag cells of one word line and flag cells of another word line that is disposed adjacent to the one word line are connected to different bit lines. In addition, in FIG. 9, on one word line, at least two main cells may be disposed between an even flag cell and an odd flag cell.

Even flag cells of the first word line W1 are connected to the even bit line E of the seventh bit line pair BP7 and the even bit line E of the 15$^{th}$ bit line pair BP15. Odd flag cells of the first word line W1 are connected to the odd bit line O of the eighth bit line pair BP8 and the odd bit line O of the 16$^{th}$ bit line pair BP16.

Even flag cells of the second word line W2 are connected to the even bit line E of the fourth bit line pair BP4 and the even bit line E of the 12$^{th}$ bit line pair BP12. Odd flag cells of the second word line W2 are connected to the odd bit line O of the fifth bit line pair BP5 and the odd bit line O of the 13$^{th}$ bit line pair BP13.

Even flag cells of the third word line W3 are connected to the even bit line E of the first bit line pair BP1 and the even bit line E of the ninth bit line pair BP9. Odd flag cells of the third word line W3 are connected to the odd bit line O of the second bit line pair BP2 and the odd bit line O of the tenth bit line pair BP10.

Accordingly, flag cells of one word line and flag cells of another word line that is disposed adjacent to the one word line are connected to different page buffer groups. Also, on one word line, an even flag cell and an odd flag cell are connected to different page buffer groups.

Unlike in FIG. 9, an even flag cell and an odd flag cell on one word line may be connected to adjacent bit lines (for example, an even bit line and an odd bit line included in one bit line pair). In this case, since program operations for the even flag cell and the odd flag cell are individually performed, flag data stored in the even flag cell and the odd flag cell may be damaged. In more detail, it is described as an example that a program operation for an even flag cell of the first word line W1 is performed and a program operation for an odd flag cell of the first word line W1 is performed. During a program operation for the odd Flag cell, flag data that has been already stored in the even flag cell may be damaged due to various factors such as an increase in a threshold voltage of the odd flag cell and a high voltage applied to the first word line W1.

In FIG. 9, on one word line, at least two main cells are provided between even flag cells and odd flag cells. Also, flag cells of one word line and flag cells of another word line that is disposed adjacent to the one word line are connected to different bit lines. Accordingly, the reliability of flag data may be improved.

Figure 10:
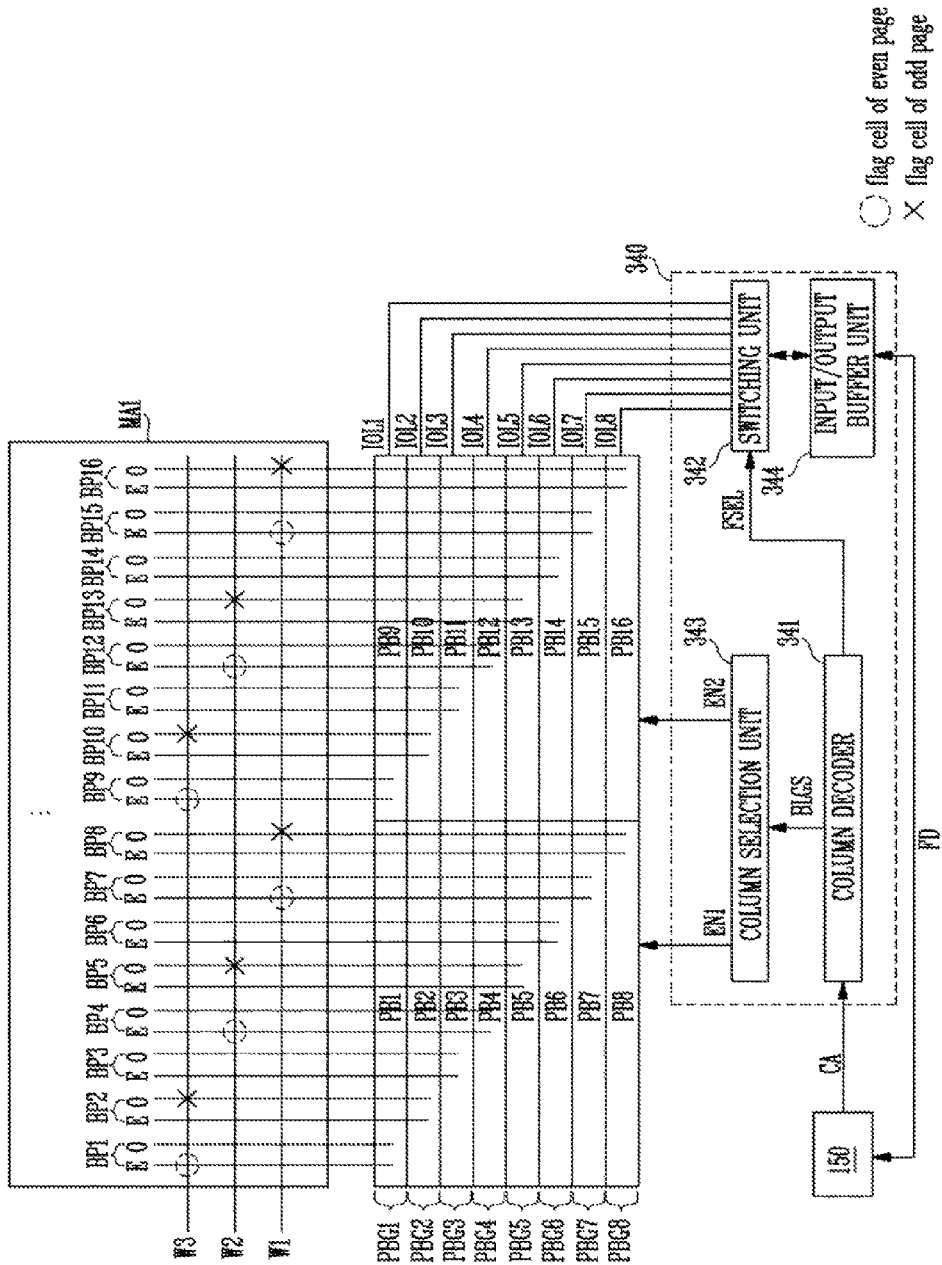
FIG. 10 is a block diagram for describing a process of transmitting data between the page buffers of FIG. 9 and a column selection circuit.

FIG. 10 is a block diagram for describing a process of transmitting data between the page buffers PB1 through PB16 of FIG. 9 and a column selection circuit 340.

Referring to FIG. 10, the control logic 150 transmits a column address CA that indicates flag cells of a selected word line to the column selection circuit 340.

The column selection circuit 340 includes a column decoder 341, a switching unit 342, a column selection unit 343, and an input/output buffer unit 344. The column decoder 341 transmits a flag selection signal FSEL to the switching unit 342 by decoding the column address CA, and generates a bit line group selection signal BLGS for sequentially selecting the page buffers PB1 through PB8 of the first column and the page buffers PB9 through PB16 of the second column.

Figure 11:
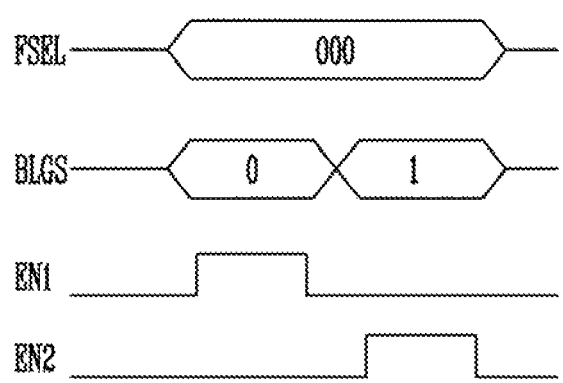
FIG. 11 is a timing diagram for describing an operation of the column selection circuit of FIG. 10.

FIG. 11 is a timing diagram for describing an operation of the column selection circuit 340 of FIG. 10.

Referring to FIG. 11, for example, when even flag cells of the third word line W3 are selected, the column decoder 341 generates a flag selection signal FSEL of a logic value "000" by decoding the column address CA. In response, the switching unit 342 electrically connects the first input/output line IOL1 and the input/output buffer unit 344.

When a logic value of the bit line group selection signal BLGS is "0", a first enable signal EN1 is enabled, and thus the first page buffer PB1 is connected to the input/output buffer unit 344. Next, when the logic value of the bit line group selection signal BLGS is "1", a second enable signal EN2 is enabled, and thus the ninth page buffer PB9 is connected to the input/output buffer unit 344. Accordingly, the first and ninth page buffers PB1 and PB9 may communicate flag data with the input/output buffer unit 344. During a program operation, flag data FD may be transmitted from the control logic 150 to the first and ninth page buffers PB1 and PB9 through the input/output buffer unit 344, the switching unit 342, and the first input/output line IOL1. During a read operation, the flag data FD that is read from the flag cells by the first and ninth page buffers PB1 and PB9 may be transmitted to the control logic 150 through the first input/output line IOL1, the switching unit 342, and the input/output buffer unit 344.

When odd flag cells of the third word line W3 are selected, the column address CA may be decoded and the flag selection signal FSEL of a logic value "001" may be generated, unlike in FIG. 11. Accordingly, the second input/output line IOL2 may be selected.

Figure 12:
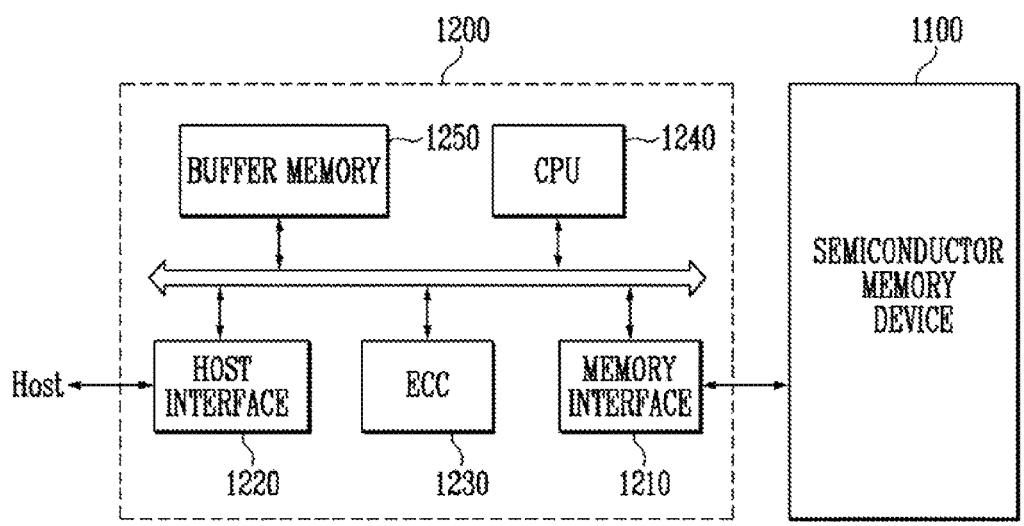
FIG. 12 is a block diagram illustrating a memory system including a semiconductor memory device, according to an embodiment of the present invention.

FIG. 12 is a block diagram illustrating a memory system 1000 including a semiconductor memory device 1100, according to an embodiment of the present invention.

Referring to FIG. 12, the memory system 1000 includes the semiconductor memory device 1100 and a controller 1200.

The semiconductor memory device 110 may be substantially the same as the semiconductor memory device 100 of FIG. 1 in terms of configuration and operation, and thus a repeated explanation is omitted.

The controller 1200 is connected to a host and the semiconductor memory device 1100. The controller 1200 is configured to access the semiconductor memory device 1100 in response to a request from the host. For example, the controller 1200 is configured to control read, write, erase, and background operations of the semiconductor memory device 1100. The controller 1200 is configured to provide an interface between the semiconductor memory device 1100 and the host. The controller 1200 is configured to drive firmware for controlling the semiconductor memory device 1100.

The controller 1200 includes a memory interface 1210, a host interface 1220, an error checking and correcting, i.e., error correcting code, (ECC) circuit 1230, a central processing unit (CPU) 1240, and a buffer memory 1250.

The memory interface 1210 transmits data that is transmitted from the buffer memory 1250 to the semiconductor memory device 1100. The memory interface 1210 transmits data that is read from the semiconductor memory device 1100 to the buffer memory 1250. The memory interface 1210 may use a NAND flash memory interface method. That is, the controller 1200 may perform program, read, and erase operations using the NAND flash memory interface method.

The host interface 1220 includes a protocol for exchanging data between the host and the controller 1200. For example, the host interface 1220 is configured to communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, or a private protocol.

The ECC circuit 1230 generates a parity bit using data that is transmitted to the semiconductor memory device 1100. The generated parity bit is stored in semiconductor memory chips of the semiconductor memory device 1100. The ECC circuit 1230 detects an error of data read from the semiconductor memory device 1100 using the parity bit. When the detected error is within an allowable correction range, the ECC circuit 1230 corrects the detected error.

The CPU 1240 analyzes and processes a signal that is inputted from the host. The CPU 1240 controls the host or the semiconductor memory device 1100 using the host interface 1220 or the memory interface 1210. The CPU 1240 may control the semiconductor memory device 1100 based on the firmware for controlling the semiconductor memory device 1100.

The buffer memory 1250 temporarily stores program data that is provided from the host or data that is read from the semiconductor memory device 1100. Also, the buffer memory 1250 may store metadata or cache data that is to be stored in the semiconductor memory device 1100. During sudden power off, the metadata or the cache data that is stored in the buffer memory 1250 is stored in the semiconductor memory device 1100. Examples of the buffer memory 1250 may include a dynamic random-access memory (DRAM) and a static random-access memory (SRAM).

The semiconductor memory device 1100 and the controller 1200 may be integrated into one semiconductor device. For example, the semiconductor memory device 1100 and the controller 1200 may be integrated into one semiconductor device to constitute a memory card such as a personal computer memory card international association (PCMCIA) card, a compact flash (CF) card, a smart media (SM) card (SMC), a memory stick, a multimedia card (MMC), a secure digital (SD) card (e.g., miniSD, microSD, or SDHC), or a universal flash storage (UFS) device.

The semiconductor memory device 1100 and the controller 1200 may be integrated into one semiconductor device to constitute a semiconductor drive (e.g., a sold-state drive (SSD)). The semiconductor drive includes a storage device that is configured to store data in a semiconductor memory. When the memory system 1000 is used as a semiconductor drive, an operation speed of the host that is connected to the memory system 1000 is dramatically increased.

Alternatively, the memory system 1000 may be applied to one of various components of electronic devices such as a computer, an ultra mobile PC (UMPC), a workstation, a netbook, a personal digital assistant (PDA), a portable computer, a web tablet, a wireless phone, a mobile phone, a smartphone, an e-book, a portable multimedia player (PMP), a portable game device, a navigation device, a black box, a digital camera, a three-dimensional (3D) television, a digital audio recorder, a digital audio player, a digital picture recorder, a digital picture player, a digital video recorder, a digital video player, a device capable of transmitting/receiving information in a wireless environment, one of various electronic devices constituting a home network, one of various electronic devices constituting a computer network, one of various electronic devices constituting a telematics network, a radio-frequency identification (RFID) device and one of various elements constituting a computing system.

For example, the semiconductor memory device 1100 or the memory system 1000 may be packaged by using various package types such as package on package (PoP), ball grid array (BGA), chip scale package (CSP), plastic leaded chip carrier (PLCC), plastic dual in line package (PDIP), die in waffle pack, die in wafer form, chip on board (COB), ceramic dual in line package (CERDIP), plastic metric quad flat package (MQFP), thin quad flat package (TQFP), small outline package (SOP), shrink small outline package (SSOP), thin small outline package (TSOP), system in package (SIP), multi chip package (MCP), wafer-level fabricated package (WFP) or wafer-level processed stack package (WSP).

Figure 13:
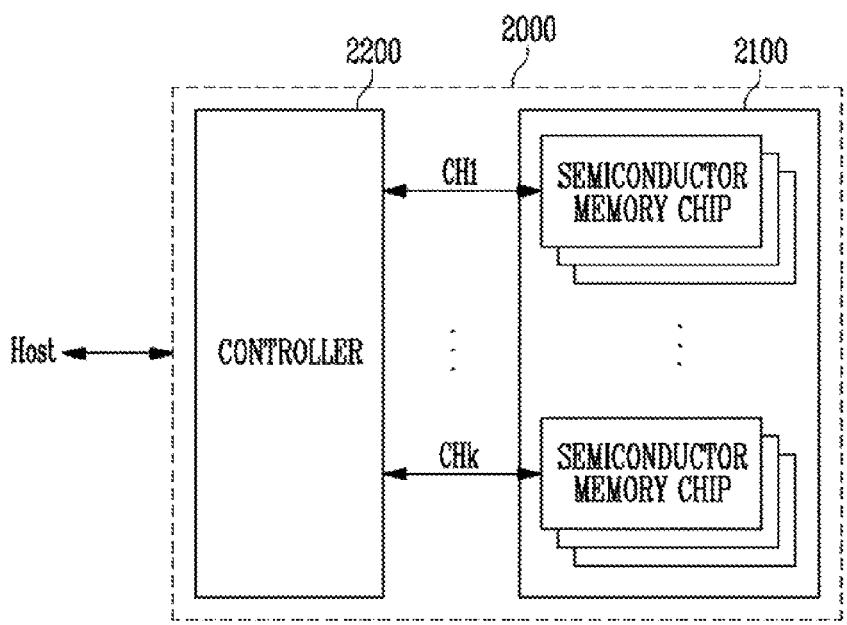
FIG. 13 is a block diagram illustrating the memory system of FIG. 12 according to an embodiment of the present invention.

FIG. 13 is a block diagram illustrating a memory system 2000 according to another embodiment of the present invention.

Referring to FIG. 13, the memory system 2000 includes a semiconductor memory device 2100 and a controller 2200. The semiconductor memory device 2100 includes a plurality of semiconductor memory chips. Each of the semiconductor memory chips may be substantially the same as the semiconductor memory device 100 of FIG. 1 in terms of configuration and operation.

The plurality of semiconductor memory chips are divided into a plurality of groups. In FIG. 13, the plurality of groups communicate with the controller 2200 through first through kth channels CH1 through CHk.

Each of the groups is configured to communicate with the controller 2200 through one common channel. The controller 2200 substantially the same as the controller 1200 of FIG. 12 in terms of configuration, and thus the controller is configured to control the plurality of memory chips of the semiconductor memory device 2100 through the plurality of channels CH1 through CHk.

It will be understood that although a plurality semiconductor memory chips are connected to one channel in FIG. 13, the memory system 2000 may be modified so that one semiconductor memory chip is connected to one channel.

Figure 14:
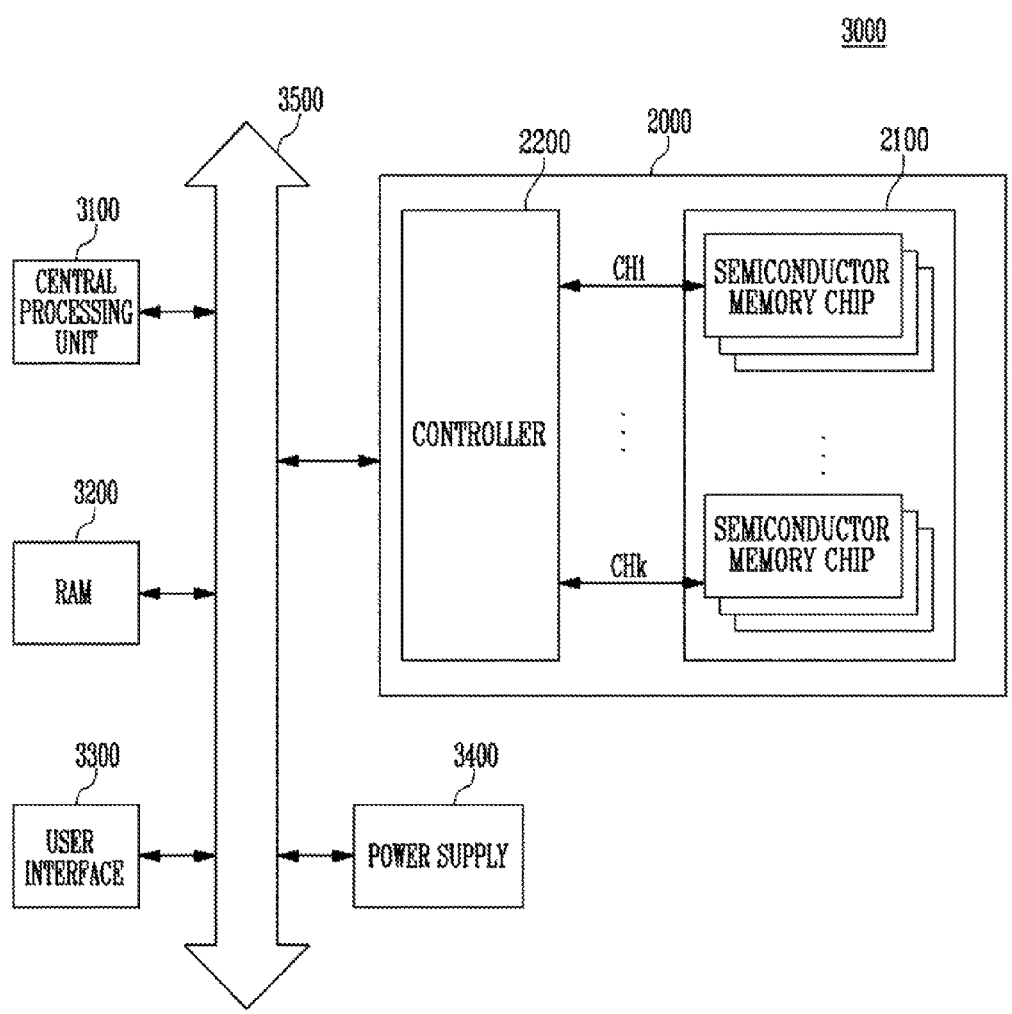
FIG. 14 is a block diagram illustrating a computing system including the memory system of FIG. 13.

FIG. 14 is a block diagram illustrating a computing system 3000 including the memory system 2000 of FIG. 13.

Referring to FIG. 14 the computing system 3000 includes a central processing unit 3100, a random-access memory (RAM) 3200, a user interface 3300, a power supply 3400, a system bus 3500, and the memory system 2000.

The memory system 2000 is electrically connected to the central processing unit 3100, the RAM 3200, the user interface 3300, and the power supply 3400 through the system bus 3500. Data that is provided through the user interface 3300 or is processed by the central processing unit 3100 is stored in the memory system 2000.

The semiconductor memory device 2100 is connected to the system bus 3500 through the controller 2200 in. FIG. 14. However, the semiconductor memory device 2100 may be directly connected to the system bus 3500. In this case, the function of the controller 2200 may be performed by the central processing unit 3100 and the RAM 3200.

The memory system 2000 of FIG. 13 is provided in FIG. 14. However, the memory system 2000 may be replaced by the memory system 1000 of FIG. 12. For example, the computing system 3000 may include both the memory systems 1000 and 2000 of FIGS. 12 and 13.

According to the one or more embodiments of the present invention, the reliability of flag data of a semiconductor memory device may be improved.

While the present invention has been particularly shown and described with reference to exemplary embodiments thereof, they are provided for the purposes of illustration and it will be understood by those of ordinary skill in the art that various modifications and equivalent other embodiments can be made from the present invention. Accordingly, the true technical scope of the present invention is defined by the technical spirit of the appended claims.

What is claimed is:

1. A semiconductor memory device comprising: a plurality of memory cells arranged in a row direction and a column direction; a plurality of word lines, each of the plurality of word lines coupled to memory cells in a row among the plurality of memory cells; N input/output lines, where N is a natural number greater than 1: and a plurality of bit lines including a first group of bit lines and a second group of bit lines, each of the plurality of bit lines coupled to memory cells in a column among the plurality of memory cells, each of the first group of bit lines and the second group of bit lines including N bit lines connected to the N input/output lines, respectively, wherein memory cells coupled to each of the plurality of word lines include main cells and flag cells storing flag data for managing the main cells, first M flag cells coupled to a first word line among the plurality of word lines are coupled to first M bit lines among the N bit lines included in the first group of bit lines, the first M bit lines connected to first M input/output lines among the N input/output lines, respectively, where M is a natural number less than N second M flag cells coupled to the first word line are coupled to second M bit lines among the N bit lines included in the second group of bit lines, the second M bit lines connected to the first M input/output lines, respectively, third M flag cells coupled to a second word line adjacent to the first word line are coupled to third M bit lines among the N bit lines included in the first group of bit lines, the third M bit lines connected to second M input/output lines different from the first M input/output lines among the N input/output lines, respectively lines, and fourth M flag cells coupled to the second word line are coupled to fourth M bit lines among the N bit lines included in the second group of bit lines, the fourth M bit lines connected to the second M input/output lines, respectively, wherein flag cells of each word line are distributed such that K (K is a natural number greater than 2) adjacent flag cells are distributed between main cells.

2. The semiconductor memory device of claim 1, wherein memory cells connected to the first word line and the third M bit lines, memory cells connected to the first word line and the fourth M bit lines, memory cells connected to the second word line and the first M bit lines and memory cells connected to the second word line and the second M bit lines do not store the flag data.

3. The semiconductor memory device of claim 1, further comprising:
 a plurality of page buffers that are arranged in the row direction and the column direction, and coupled to the plurality of bit lines,
 wherein the plurality of page buffers are divided into page buffer groups, each of the page buffer groups comprising N page buffers that are arranged in the row direction and coupled to the N input/output lines, respectively.

4. The semiconductor memory device of claim 3, wherein the first M flag cells of the first word line and the second M flag cells of the first word line are coupled to different page buffer groups.

5. The semiconductor memory device of claim 3, wherein the first M flag cells of the first word line are coupled through the first M bit lines to a first page buffer group among the page buffer groups, and
the third M flag cells of the second word line are coupled, through the third M bit lines to the first page buffer group.

6. The semiconductor memory device of claim 3, wherein the first M flag cells of the first word line are coupled through the first M bit lines to first and second page buffer groups among the page buffer groups, and
the third M flag cells of the second word line are coupled through the third M bit lines to third and fourth page buffer groups among the page buffer groups.

7. The semiconductor memory device of claim 3, further comprising:
a control logic suitable for generating a column address that indicates flag cells coupled to a selected word line among the word lines.

8. The semiconductor memory device of claim 7, further comprising:
a column selection circuit suitable for selecting one among the page buffer groups in response to the column address.

9. The semiconductor memory device of claim 8, wherein the column selection circuit transmits flag data from the control logic to a selected page buffer group through a corresponding input/output line during a program operation for the flag cells of the selected word line, and transmits flag data from the selected page buffer group to the control logic through a corresponding input/output line during a read operation for the flag cells of the selected word line.

10. The semiconductor memory device of claim 1, wherein flag cells of each word line are distributed such that one flag cell is distributed between main cells.

11. The semiconductor memory device of claim 1, wherein the bit lines each comprise a pair of even and odd bit lines, and the memory cells of the each word line comprise a first page coupled to the even bit lines and a second page coupled to the odd bit lines,
wherein at least two main cells are disposed between a flag cell of the first page and a flag cell of the second page.

12. A semiconductor memory device comprising:
a plurality of memory cells in which data is stored arranged in a row direction and a column direction;
a plurality of bit lines coupled to the plurality of memory cells; and
a plurality of page buffers, each of the plurality of page buffers coupled through a corresponding bit line to memory cells in a column among the memory cells, the plurality of page buffers divided into page buffer groups including a first page buffer group and a second page buffer group, each of the page buffer groups including N page buffers coupled to N input/output lines respectively,
wherein memory cells in each row include main cells and flag cells storing flag data for managing the main cells,
first M flag cells of a first row are coupled to first M page buffers of the first page buffer group coupled to first M input/output lines among the N input/output lines, respectively, where M is a natural number less than N,
second M flag cells of the first row are coupled to second M page buffers of the second page buffer group coupled to the first M input/output lines, respectively,
third M flag cells of a second row adjacent to the first row are coupled to third M page buffers of the first page buffer group coupled to the second M input/output lines among the N input/output lines respectively, and
fourth M flag cells of the second row are coupled to fourth M page buffers of the second page buffer group coupled to the second M input/output lines, respectively.

13. The semiconductor memory device of claim 12, further comprising:
a control logic suitable for generating a column address that indicates flag cells of a selected row.

14. The semiconductor memory device of claim 13, further comprising:
a column selection circuit that suitable for selecting one among the page buffers in response to the column address,
wherein the column selection circuit transmits flag data from the control logic to a selected page buffer during a program operation for the flag cells of the selected row, and transmits flag data from the selected page buffer to the control logic during a read operation for the flag cells of the selected row.

15. The semiconductor memory device of claim 12, wherein memory cells connected to the first word line and the third M page buffers, memory cells connected to the first word line and the fourth M page buffers, memory cells connected to the second word line and the first M page buffers and memory cells connected to the second word line and the second M page buffers do not store the flag data.

16. The semiconductor memory device of claim 12, wherein the first M flag cells of the first row are further coupled to a third page buffer group among the page buffer groups, and
the third M flag cells of the second row are further coupled to a fourth page buffer group among the page buffer groups.

17. The semiconductor memory device of claim 12, wherein the flag cells of each row include two adjacent flag cells.

18. The semiconductor memory device of claim 12, wherein the flag cells of each row include two flag cells and one or more main cells disposed therebetween.

19. The semiconductor memory device of claim 12, wherein the flag cells of each row include two flag cells and two or more main cells disposed therebetween.

\* \* \* \* \*